(12) United States Patent
Martinez et al.

(10) Patent No.: US 12,211,388 B2
(45) Date of Patent: Jan. 28, 2025

(54) ANALYSIS OF AIRCRAFT TRAJECTORIES

(71) Applicant: THALES, Courbevoie (FR)

(72) Inventors: Dorian Martinez, Toulouse (FR); Christophe Pierre, Toulouse (FR); Jori Ferrus, Toulouse (FR); Philippe Francez, Toulouse (FR)

(73) Assignee: THALES, Courbevoie (FR)

( * ) Notice: Subject to any disclaimer, the term of this patent is extended or adjusted under 35 U.S.C. 154(b) by 315 days.

(21) Appl. No.: 17/629,737

(22) PCT Filed: Jul. 23, 2020

(86) PCT No.: PCT/EP2020/070740
§ 371 (c)(1),
(2) Date: Jan. 24, 2022

(87) PCT Pub. No.: WO2021/013908
PCT Pub. Date: Jan. 28, 2021

(65) Prior Publication Data
US 2022/0254259 A1    Aug. 11, 2022

(30) Foreign Application Priority Data
Jul. 25, 2019 (FR) .................................... 1908394

(51) Int. Cl.
*G08G 5/00*  (2006.01)
*G06N 3/04*  (2023.01)

(52) U.S. Cl.
CPC ............. *G08G 5/0043* (2013.01); *G06N 3/04* (2013.01); *G08G 5/0021* (2013.01); *G08G 5/003* (2013.01); *G08G 5/0056* (2013.01)

(58) Field of Classification Search
None
See application file for complete search history.

(56) References Cited

U.S. PATENT DOCUMENTS 10,248,742 B2    4/2019    Desell et al.
2008/0091630 A1  4/2008    Bonissone et al.
(Continued)

OTHER PUBLICATIONS

Li, et al., "Anomaly detection in onboard-recorded flight data using cluster analysis", 2011 IEEE/AIAA 30th Digital Avionics Systems Conference, 2011.
(Continued)

*Primary Examiner* — Thomas E Worden
(74) *Attorney, Agent, or Firm* — BakerHostetler (57) ABSTRACT

Devices and computer-implemented methods for analyzing aircraft trajectories, the method includes the steps of receiving data associated with a plurality of aircraft trajectories; breaking the trajectories down into a plurality of vectors, a vector comprising one or more sequences of enumerators; aligning multiple vectorized trajectories by shifting sequences of enumerators by one or more positions; and detecting one or more anomalies in one or more trajectories by unsupervised classification (e.g. DBSCAN). Developments describe the supervised determination of trajectory anomaly detection models, the use of density-based algorithms, the use of one or more neural networks and/or decision trees, one or more display steps, notably displaying root causes (explainable or understandable artificial intelligence), the processing of avionics data flows, etc. System (e.g. computing) and software aspects are described.

12 Claims, 3 Drawing Sheets

(56) References Cited

U.S. PATENT DOCUMENTS

| | | | | |
|---|---|---|---|---|
| 2010/0207762 A1* | 8/2010 | Lee | ............... | G06V 20/52 |
| | | | | 340/541 |
| 2011/0208374 A1* | 8/2011 | Jayathirtha | ......... | G01C 23/005 |
| | | | | 701/4 |
| 2015/0324501 A1* | 11/2015 | Desell | ............ | G06F 30/20 |
| | | | | 703/2 |
| 2020/0042012 A1* | 2/2020 | Zander | ............ | G05D 1/0276 |

OTHER PUBLICATIONS

Olive, et al., "Identifying Anomalies in past en-route Trajectories with Clustering and Anomaly Detection Methods", ATM Seminar 2019, Jun. 1, 2019.

\* cited by examiner

| _ _ _ _ NNG<br>DNNGN<br>1111011 = 6 | _ _ _ NN G<br>DNNGN<br>1 1 1101 = 5 | _ _ NNG<br>DNNGN<br>1 1 011 = 4 | _ NNG<br>DNNGN<br>1 0001 = 2 |
|---|---|---|---|
| NNG _ _<br>DNNG N<br>1011 1 = 4 | NNG _ _ _<br>_ DN N G N<br>111111 = 6 | NGG _ _ _ _<br>_ D N N G N<br>1111111 = 7 | |

|   |   |   | A | B | A | D |   |
|---|---|---|---|---|---|---|---|
| B | D | E | D |   |   |   |   |
| 1 | 1 | 1 | 1 | 1 | 1 | 1 | 7 |

|   |   | A | B | A | D |   |
|---|---|---|---|---|---|---|
| B | D | E | D |   |   |   |
| 1 | 1 | 1 | 1 | 1 | 1 | 0 | 6 |

|   | A | B | A | D |   |   |
|---|---|---|---|---|---|---|
| B | D | E | D |   |   |   |
| 1 | 1 | 1 | 1 | 1 | 0 | 0 | 5 |

| A | B | A | D |   |   |   |
|---|---|---|---|---|---|---|
| B | D | E | D |   |   |   |
| 1 | 1 | 1 | 0 | 0 | 0 | 0 | 3 |

| A | B | A | D |   |   |   |
|---|---|---|---|---|---|---|
|   | B | D | E | D |   |   |
| 1 | 0 | 1 | 1 | 1 | 0 | 0 | 4 |

| A | B | A | D |   |   |   |
|---|---|---|---|---|---|---|
|   |   | B | D | E | D |   |
| 1 | 1 | 1 | 0 | 1 | 1 | 0 | 5 |

| A | B | A | D |   |   |   |
|---|---|---|---|---|---|---|
|   |   |   | B | D | E | D |
| 1 | 1 | 1 | 1 | 1 | 1 | 1 | 7 |

510 / 500 / 3 though with enough level of realism for the detection of anomalies to be performed). The trajectories manipulated can also be historical trajectories, for example archives of real flights, which are used as a reference.

ANALYSIS OF AIRCRAFT TRAJECTORIES

CROSS-REFERENCE TO RELATED APPLICATIONS

This application is a National Stage of International patent application PCT/EP2020/070740, filed on Jul. 23, 2020, which claims priority to foreign French patent application No. FR 1908394, filed on Jul. 25, 2019, the disclosures of which are incorporated by reference in their entirety.

FIELD OF THE INVENTION

The invention relates to the field of avionics in general and, in particular, that of learning with respect to the detection of anomalies in the trajectory of an aircraft.

BACKGROUND

The technical issue of anomaly detection is known in computing. However, the known solutions in the matter address the problem only imperfectly in the very specific field of avionics.

There is in fact currently no so-called "massive testing" technique for detecting anomalies in aircraft trajectories. In other words, there are no suitable methods for conducting tests in a context in which the masses of data are very great ("Big Data" context).

The provision of big data offers opportunities for the use of machine learning techniques. In particular, there is a need with respect to the automatic detection of abnormal aircraft trajectories. However, to be efficient, this detection must be based on modelings of human analyses concerning flight management systems, known by the acronym FMS.

In a Big data context, it is important to recognize known anomalies or problems (i.e. predefined objects) but also to identify unknown problems (unknowns). Moreover, this dual detection must be performed independently, ultimately, of human expertise (e.g. tester or user).

According to the state of the art, the known approaches make it possible to detect one or more known anomalies (i.e. anomalies which are characterized or predefined) in big data, for example by checking predefined logic rules. On the other hand, the unresolved initial technical problem is identifying a priori unknown anomalies, and doing so with high analysis quality.

SUMMARY OF THE INVENTION

The document describes devices and computer-implemented methods for analyzing aircraft trajectories, the method comprising the steps of receiving data associated with a plurality of aircraft trajectories; breaking said trajectories down into a plurality of vectors, a vector comprising one or more sequences of enumerators; aligning several vectorized trajectories by shifting sequences of enumerators by one or more positions; and detecting one or more anomalies in one or more trajectories by unsupervised classification (e.g. Density-Based Spatial Clustering of Applications with Noise (DBSCAN)). Developments describe the supervised determination of trajectory anomaly detection models (160), the use of density-based algorithms, the use of one or more neural networks and/or decision trees, one or more display steps, notably displaying root causes (explainable or understandable artificial intelligence, the processing of avionics data flows, etc. System (e.g. computing) and software aspects are described.

Advantageously, the anomaly detection models determined by the invention can be carried onboard an aircraft. In other words, it is not always necessary to have the data (which can be very voluminous, several terabytes or petabytes of data) onboard. In fact, the weightings in the neural networks (for example) "encode" the data (for example the millions of images do not need to be onboard once the neural network has processed them).

Advantageously, the vectorizations of the trajectories according to the various embodiments of the invention improve the efficiency of the classification algorithms.

Advantageously, it is possible to identify an unknown anomaly (a new anomaly), even if the volume of data handled is low (if appropriate, it exploits the expertise encoded in the performance of the test).

Advantageously, embodiments of the invention make it possible to obtain a flight management system or FMS that is more robust by virtue of the validation of a vast set of trajectories (or of new trajectory databases). A virtuous circle can thus be put in place: the identification of new anomalies can make it possible to retrain the prediction model, and, conversely, the improved prediction model allows new anomalies.

Advantageously, the invention makes it possible to perform, on the ground, with great computation powers, machine learning methods performed on big data, then to have a trained model onboard that requires few computation resources.

BRIEF DESCRIPTION OF THE DRAWINGS

Other features and advantages of the invention will emerge from the following description and the from the figures of the attached drawings in which.

DETAILED DESCRIPTION

According to embodiments of the invention, an "aircraft" can be a drone, or a commercial airplane, or a freight airplane, or even a helicopter, with or without passengers onboard. More generally, the term "aircraft" in the description below can be replaced by the terms vehicle, car, truck, bus, train, motor cycle, boat, robot, submarine, toy, etc., or any element that can be remotely piloted (by radio link, satellite, or other means), at least partially (intermittently or periodically, or even opportunistically over time).

The trajectories manipulated can be of different kinds. Generally, the trajectories manipulated correspond to real flights, for which measurements have been performed. By analyzing the past real flights, a present or routine or current flight can be monitored (the data flow is analyzed so as to detect an anomaly in "real time". A future flight (for example simulated) can also be manipulated and gauged or monitored according to the various embodiments of the invention (prediction of admissible trajectories, i.e. anomaly-free trajectories). By extension, the trajectories manipulated can also be "virtual" trajectories and not real (e.g. simulated, likely, computed, etc.). The origin of the trajectories can, moreover, be conserved by the management of metadata (data on data); the weightings can possibly be performed (e.g. a measured datum having greater weight than a datum generated by the machine). Even more generally, the trajectories manipulated by the invention can be trajectories in 3D (3 dimensions of space), but also trajectories of N dimensions. For example, the trajectories can be 4D trajectories 4D (3D plus time), 5D trajectories with fuel, 6D trajectories with meteorology, etc.). An anomaly can relate to one or more of these dimensions or parameters.

The anomalies manipulated by the invention can be of different kinds. The anomalies can be trajectory anomalies, which can be indicative of a certain number of underlying problems. More generally, anomalies can relate to any type of data, for example security logs, FMS output data, meteorological information, NOTAM data, etc. A wide variety of anomalies are possible (unnecessary lateral loop, thrust mode selected for a very short time, unnecessary airbrake extension/retraction, etc.).

In the context of the invention, the anomalies manipulated are primarily trajectory anomalies. Downstream of the method according to the invention, some advantageous embodiments notably comprise the sale of trajectory validation services. These analyses can be of use to a wide variety of actors, for example to the designer of aeronautical procedures, to A424 providers, to airlines (analysis of database cycles, opening of routes, analysis of pilot behaviors, analysis of instructions from air traffic control (e.g. detection of abnormal or suspect behaviors), analysis of fuel consumptions, etc.).

In one embodiment, the anomalies detected are stored, for subsequent reference. An anomaly can be associated with numerous metadata: nature of the anomaly, quantitative aspects (numerical, static and/or dynamic values, e.g. drifts, etc.), status (e.g. suspicion, denied, confirmed, proven), relationships (e.g. root cause, third-party causality relationships or correlations, etc.). In one embodiment, anomalies are stored in a block chain (e.g. proven, "true" anomalies, as approved by distributed consensus between pilot, airline and ATC for example).

The expression "Big Data" denotes the collection and analysis of data, performed on a massive scale. This concept is associated with characteristics of a technical nature which comprise: the volume (e.g. large data collections, even if redundant), the variety (e.g. numerous different sources are used), the velocity (e.g. the data are "fresh" or constantly updated in changing or dynamic environments), attesting to a certain veracity (e.g. the weak signals which are embedded in the noise are not eliminated and can consequently be detected or amplified), to ultimately represent a certain value (for example the usefulness from the technical and/or business point of view). The present invention significantly reinforces the velocity and veracity characteristics of the data (data that are fresh or valid, not obsolete or otherwise dated).

Different types of machine learning are possible. Machine learning is an area of computing which uses statistical techniques to give the computing systems the possibility of "learning" with data (for example, to progressively improve the performance of a specific task), and do so without being explicitly programmed for that purpose.

Machine learning is useful for the detection and the recognition of patterns or schemes. It is generally easier to collect the data (for example, the data from a video game or company) than to explicitly write the program which governs the game considered. Furthermore, the neural networks (hardware embodiment of the machine learning, or software emulation) can be reused to process new data. Machine learning can be performed on particularly voluminous data, that is to say by using as much data as possible (e.g. stability, convergence, weak signals, etc.). New data can be added permanently and the learning can be refined.

Different learning algorithms can be used, in combination with the characteristics according to the invention. The method can comprise one or more algorithms from among the algorithms comprising: "support vector machines" (SVM); "boosting" (classifiers); neural networks (in unsupervised learning); decision trees ("Random Forest"), statistical methods such as gaussian mixture model; logistical regression; linear discriminant analysis; and genetic algorithms.

The machine learning tasks are generally classified in two major categories, depending on whether there is a "signal" or there are learning inputs or "information feedbacks" or "available outputs".

The expression "supervised learning" designates a situation in which the computer is presented with the examples of inputs and examples of outputs (real or desired). The learning then consists in identifying an interlacing of rules that match the inputs to the outputs (these rules can be understandable or not to a person).

The expression "semi-supervised learning" designates a situation in which the computer receives only an incomplete data set: for example, there are missing output data. It is therefore possible to add missing data to switch to an unsupervised mode. Another means consists in using external filters (corresponding, for example, to known scenarios), to filter the output data and confirm/deny the anomalies detected by unsupervised learning. Finally, it is possible to adjust the weighting between the various algorithms implemented for the detection of anomalies and/or to parameterize one or more parameters thereof. The expression "semi-supervised" does not therefore mean that a human contribution is necessary (at least directly).

The expression "reinforcement learning" consists in learning the actions to be taken, based on experiences, so as to optimize a quantitative reward over time. Through iterated experiences, a decisional behavior (called strategy or policy, which is a function associating the action to be executed with the current state) is determined as being optimal, in that it maximizes the sum of the rewards over time.

The expression "unsupervised learning" (also called deep learning) designates a situation in which no annotation exists (no label, no description, etc.), leaving the learning algorithm alone to find one or more structures, between inputs and outputs. The unsupervised learning may be an objective in itself (discover structures hidden in the data) or a means of arriving at an objective (learning by functionalities).

According to the embodiments, the human contribution in the machine learning steps can vary. In some embodiments, the machine learning is applied to the machine learning itself (reflexive). All of the learning process can in fact be computerized, notably by using multiple models and by comparing the results produced by these models. In most cases, humans participate in the machine learning ("human in the loop"). The developers or curators are responsible for maintaining the aggregates of data: ingestion of data, cleaning of the data, discovery of models, etc. In some cases, the person does not have to intervene, the learning is entirely automatic once the data is made available.

The machine learning used in combination with the features according to the invention benefits generally from the fact of having large quantities of data. The expression "big data" designates the collection and the analysis of data, performed on a massive scale. This concept is associated with characteristics of a technical nature which comprise: the volume (e.g. large collections of data, even if they are redundant), the variety (e.g. numerous different sources are used), the velocity (e.g. the data are "fresh" or constantly updated in changing or dynamic environments), attesting to a certain veracity (e.g. the weak signals which are embedded in the noise are not eliminated and can consequently be detected or amplified), to ultimately represent a certain value (for example of usefulness from the technical and/or business point of view).

In one embodiment, a "policy-based" learning method can be used. The policy-based methods are iterative methods alternating phases of evaluation and of improvement of the policy. They are based on the current estimation of the value (respectively quality) function in the current state to determine the choice of the next action (control), and, after observation of the new current state and of the reinforcement signal received, the model which was employed is updated. One conventional example of this type of method is the SARSA algorithm.

In one embodiment, a "non-policy" learning method can be used. The non-policy methods are, for their part, not sensitive to the manner in which the actions are selected at each instant but only to the observation of a control policy that has a sufficient level of exploration. Because of this, they can freely observe a different control policy (that may be sub-optimal). A conventional example of a non-policy algorithm is the Q-learning algorithm.

In one embodiment, a computer-implemented method is described for the analysis of aircraft trajectories, the method comprising the steps of receiving data associated with a plurality of aircraft trajectories; breaking said trajectories down into a plurality of vectors, a vector comprising one or more sequences of enumerators; aligning multiple vectorized trajectories by shifting sequences of enumerators by one or more positions; detecting one or more anomalies in one or more trajectories by unsupervised classification.

Vectors

A vector contains types of values or symbols or "enumerators" out of a finite plurality. In one embodiment, the vectors comprise strings of symbolic characters. A character represents a class, and this is merely one means of representing it. A digit works just as well. In computer programming, an enumerated type (often called enumeration, sometimes enumerative type or enumerative list) is a type of data which consists of a set of constant values. When a variable is of enumerated type, it can have any case of this enumerated type as its value. For example, ordinary playing cards can be represented by enumerations (color and height). The boolean (logic) type is a predefined enumerated type which has two enumerators ("true" and "false").

In one embodiment, the trajectories are vectorized. The breakdown into vectors is performed so as to conserve the information contained in the succession of the flight segments. The objective is to unify the number of parameters of each trajectory. For different times and distances, the number of input parameters of the algorithms is identical. Advantageously, the vectorization of the trajectories makes it possible to conserve all the information on the trajectory/procedure and to reduce the deformation (e.g.: not "break the slope", the notion of order in a sequence of legs, etc.).

In one embodiment, the method comprises steps consisting in determining one or more trajectory characteristics, said characteristics comprising notably the weight, the version of the flight management system, the version of the navigation database, the version of the performance model.

Alignment

The alignment of sequences (or sequential alignment) manipulates sequences (of symbols, of words, of digits, etc.) so as to reveal therein the regions that are "homologous" or "similar" or "identical". Different algorithms can be used: Smith-Waterman algorithm, use of similarity matrices, substitution matrices, dynamic programming, etc.

Unlike the methods used in bio-computing which allow a breakdown into sub-sequences (introduction of "holes" at certain positions in the sequences, associated with penalties), the trajectories that are vectorized according to the invention cannot be distorted at such a point. The alignment step needs to be performed without the introduction of holes (or operational gaps). The comparison of sub-sequences must be performed with care, because changes of levels would risk for example being compared to descents for landing.

The inclusion of metadata (e.g. type of craft, distance flown, etc.), if available, can make it possible to determine reasonable comparisons. Intermediate clustering or selection steps can therefore be added.

The alignment methods can either try to align the sequences over all of their length, this then being referred to as global alignment, or be restricted to limited regions in which the similarity is strong, to the exclusion of the rest of the sequences, this then being called local alignment.

With respect to the alignment of sequences, two main types can be distinguished, according to their complexity of implementation. Pairwise alignment consists in aligning two sequences using an algorithm of polynomial complexity. It is possible to produce a global alignment (i.e. between the two sequences over all of their length) or else a local alignment (i.e. between one sequence and a part of the other sequence).

A multiple alignment consists in aligning more than two sequences and requires a computation time and a storage space that are exponential as a function of the size of the data.

According to the embodiments, one or more sub-chains can be determined. An alignment of chains can notably comprise the Needleman-Wunsch or Smith-Waterman algorithm or the Burrows-Wheeler transform.

In some embodiments, the similarity measurement can comprise the computation of a distance. In mathematics, the expression distance over a set E denotes any application d defined over the product E×E and with values in the set of positive real numbers, bearing out the following properties of symmetry $\{d(a,b)=d(b,a)\}$, of separation $\{d(a,b)=0$ equivalent to $a=b\}$ and of triangular inequality $\{d(x,z) \leq d(x,y)+d(y,z)\}$. A set provided with a distance is called a metric space. The distances used according to the embodiments can vary; they can notably comprise distances of Jaro-Winkler type, or a Levenshtein distance, or even a Hamming distance. From the mathematical point of view, it is by the differences in distance between two data that their degree of similarity or of sameness (e.g. proportional transformation), etc. is measured.

The comparisons between sequences obey business logics, which are those of avionics. Among others, it is possible to determine the flight procedures that are similar, the changes of levels that are similar, the approaches (e.g. final descent), and, on the other hand, to determine the values or sequences or chains that are abnormal (predefined thresholds or threshold ranges).

In one development for different flight times and distances covered, the number of input parameters of the algorithms must be identical. The difficulty is to conserve all of the information on the trajectory/procedure and to reduce the "deformation" of the data (e.g.: not to "break the slope", the notion of order in a sequence of legs, etc.).

Management of the sequences of classes is advantageous. In one embodiment, a (lateral) trajectory comprises a succession of Left or L, Right or R, and Straight or S segments.

In one development, a distance or sameness or similarity can make it possible to conserve the order in the sequence, while allowing shifts in order to best model the sameness between two trajectories (in particular one trajectory which would be a subset of the other).

Anomaly Detection

In the data exploration, the anomaly detection (or "outlier detection") is the identification of rare elements, events or observations which raise suspicions by differing significantly from most of the other data. There are three major categories of anomaly detection techniques: the so-called unsupervised techniques, the so-called supervised techniques and the semi-supervised techniques.

In more detail, the unsupervised anomaly detection techniques detect the anomalies in a set of unlabeled data. Generally, it is assumed that most of the data is normal and the deviant data are sought. The supervised anomaly detection techniques operate on data which are tagged or labeled or otherwise annotated (according to binary discretizations, e.g. normal or abnormal, or quantified e.g. scores). These techniques involve training a "classifier". In machine learning, the term (linear) classifier designates statistical classification algorithms. A classifier aims to classify into classes samples which have similar properties, measured on observations. A linear classifier is a particular type of classifier, operating by linear combination of the samples.

The anomaly detection techniques comprise one or more of the techniques comprising: a density-based technique (for example the k closest neighbors method, the "local outlier factor" method); a support vector machine (with one class); a recurrent neural network; a self-encoder; one or more Bayesian networks; hidden Markov models; analyses by data partitioning; by deviation from association rules; fuzzy logic or set machine learning techniques.

Unsupervised Classification

The unsupervised classification or "unsupervised clustering" methods notably comprise data partitioning. The data partitioning (or "data clustering") is a data analysis method. It aims to divide a data set into different homogeneous groups, such that the data of each group bear common properties. There are multiple data partitioning methods, including the centroid-based methods such as the k-means or k-medoids algorithms; the hierarchical grouping methods; the expectation maximization (EM) algorithms; density-based algorithms such as DBSCAN or OPTICS; connectionist methods such as self-adaptive mapping.

It is possible to use a proximity (similarity) criterion, by introducing measures or classes of distance between objects. A partitioning can aim to minimize the intra-class inertia (to obtain homogeneous groups) and/or to maximize the inter-class inertia (in order to obtain well differentiated subsets).

In other embodiments, the partitioning is a hierarchical or dendrogram "clustering".

The fact that the classification is unsupervised means that "machine learning" techniques will make it possible to find certain similarities to be able to classify the data. This type of analysis makes it possible to have a profile of the different groups. That therefore makes it possible to simplify the analysis of the data by revealing the common points and the differences and by thus reducing the number of variables of the data. This technique is not only used in the genetic field, but also for example makes it possible to list potential clients in an advertising campaign.

In one development, the method comprises a step consisting in detecting one or more anomalies in one or more trajectories by unsupervised classification. In one embodiment, the method comprises a step of detecting one or more abnormal trajectories by unsupervised classification (130).

When a trajectory is determined or said to be "abnormal" (interpretability of the results), it is "globally" abnormal (the point or points at which the trajectory is deviant or leads to the existence of an excessive distance are not necessarily directly available). In one embodiment, the method comprises the steps of determining the sequence of enumerators or the character string (or the plurality of these sequences) which lead to the abnormality of this trajectory (by considering thresholds or ranges of thresholds given for the distance considered), and optionally of displaying these local deviations. The search can for example be iterative (local min-max) or combinatorial.

In one development, the method further comprises a step of determining one or more models of unsupervised detection of trajectory anomalies.

A method for creating anomaly detection models is described based on unsupervised learning (detection of unknown problems). Most of the unsupervised algorithms do not have any capacity for prediction on new data. A supervised algorithm is then trained on the basis of the trajectories labeled by the unsupervised algorithms in their training.

This mechanism for example makes it possible to model, by machine learning, the manners that the procedures have of reacting to variation of weight, in order to find anomalies through this line of study.

In one development, the method comprises a step of determining if a trajectory is abnormal (by parts or portions, etc.). Different models can be invoked. These models are used in a machine learning context which can be extremely intensive in terms of resources (computation and/or storage), but these constraints do not however preclude them from being loaded onboard.

Consequently, the model (learned), for its part, can be used in a constrained context (notably onboard). It can be used in an environment with restricted resources, i.e. when it is loaded onboard. It can notably operate with a reduced volume of data.

The advantage of this embodiment consists in the compression of the model and its operation when loaded onboard (i.e. on a computer, e.g. a tablet or a laptop, of non-avionics type). In other words, computation resources can be advantageously reduced ("onboard functional compression").

In one development, the unsupervised classification uses one or more density-based algorithms.

In one development, the method comprises a density-based algorithm which is of DBSCAN and/or Isolation Forest (IFOREST) type.

Among these unsupervised partitioning algorithms, one advantageous embodiment of the invention comprises a data partitioning using one or more density-based algorithms.

The DBSCAN algorithm is particularly advantageous, in that it concerns the search for anomalies. Alternatively, the use of a k-means method makes it possible to determine normal or nominal trajectories, but would require another step of determining one or more thresholds and then of applying these thresholds to determine the abnormal values.

In one development, an anomaly detection model comprises one or more neural networks and/or decision trees.

In one development, an anomaly detection model correlates one or more of the determined anomalies with one or more predefined root causes, the method further comprising the step of displaying, in the cockpit or to the pilot, one or more of said predefined root causes.

Root cause analysis consists in analyzing and processing the causes of a problem rather than the symptoms.

The root causes are predefined from among a plurality. This embodiment makes it possible to improve the interpretability, i.e. the capacity to render the data and/or models interpretable.

In one development, the method further comprises the step of receiving a confirmation or a denial of the existence of an anomaly.

In concrete terms, and for example, the method can determine that a given anomaly is associated with a foil flaps problem. The display of the origin of this problem, thus determined by the machine, can assist the human being in his or her decision-taking. So as to be conservative, in the absence of a response from the pilot, the anomaly and its cause can be considered to be true. In other words, the pilot calling on his experience, may deliberately avoid making any assumption.

The relationships established by learning between the input data on the one hand and the output data on the other hand can be complex. These relationships can be understandable or not to a person. The steps of the method can contribute to the "intelligibility" (or the "interpretability" or "explainability") of the relationships established by the computer-implemented programs. Notably, it is possible to display one or more intermediate computation states in order for the pilot to grasp what is happening. The black box of computations performed in deep learning may be bracketed, for example, by checkpoints or key steps or other checks (absence of divergence, intermediate results, mapping of the root causes with expressions in plain language that are directly understandable to the pilot without the need of interpretation, etc.).

A display step can be performed via an HMI (Human-Machine Interface). In addition to—or instead of—the screens of the onboard FMS computer and/or EFB ("Electronic Flight bag"), additional HMI means can be used (e.g. connected watches, holograms, etc.). Generally, the FMS avionics systems (which are systems certified by the air regulator and which can have certain limitations in display and/or ergonomics terms) can advantageously be complemented by non-avionics means, in particular advanced HMIs. In particular, said human-machine interfaces can make use of virtual and/or augmented reality headsets (semi-transparent augmented reality headset or configurable transparency headset) worn by the pilot. An individual display headset can be a virtual reality (VR) headset or an augmented reality (AR) or a head-up display, etc. The headset can therefore be a "head-mounted display", a "wearable computer", or "glasses". The headset can comprise computation and communication means, projection means, audio acquisition means and video projection and/or video acquisition means. That way, the pilot can—for example by means of voice commands—configure the display of the flight plan in three dimensions (3D). Using appropriate interfaces, the pilot can determine one or more viewing perspectives. In a 3D embodiment, the pilot can reconfigure the display (e.g. determine the perspective shown by a solid angle) from any point of space (e.g. freely selected). The information displayed in the headset can be entirely virtual (displayed in the individual headset), entirely real (for example projected onto the flat surfaces available in the real environment of the cockpit) or a combination of the two (partly a virtual display superposed on or merged with the reality and partly a real display via projectors). The display can also be characterized by the application of predefined placement rules and display rules. For example, the human-machine interfaces (or the information) can be "distributed" (segmented into distinct portions, possibly partially redundant, then divided up) between the different virtual or real screens (e.g. FMS, TAXI).

In one development, the trajectories are or comprise lateral trajectories, and/or vertical trajectories and/or thrust modes. For example, an anomaly can be a non-optimal lateral trajectory like a loop (an unnecessary) 360°. An anomaly can consist of a sequencing of non-optimal thrust modes such as a mode selected for a very short time. An anomaly can be a non-optimal aerodynamic configuration, e.g. such as entries into and exits from high lift configurations, or unnecessary extension or retractions of airbrakes.

In one development, the method further comprises a step of receiving avionics data on the trajectory of said aircraft, for example from the flight management system, and of determining one or more anomalies from said one or more anomaly detection models.

In one development, the method further comprises a step of communicating said one or more anomalies determined during the flight of one or more aircraft. For example, an anomaly can be transmitted to the ATC and/or to the airline, according to predefined rules. An anomaly can be recorded in the black box of the aircraft. An anomaly can be communicated peer-to-peer to one or more other aircraft, for example within an airline.

This embodiment is optional and is dependent on an organization between entities for the correct processing of the detections.

A computer program product is described, said computer program comprising code instructions making it possible to perform one or more of the steps of the method, when said program is run on a computer.

A system is described for analyzing aircraft trajectories, the system comprising means for implementing one or more of the steps of the method.

In one development, a system is described, comprising one or more neural networks chosen from among the neural networks comprising:—an artificial neural network; an acyclic artificial neural network; a recurrent neural network; a feedforward neural network; a convolutional neural network; a generative adversarial neural network.

Figure 1:
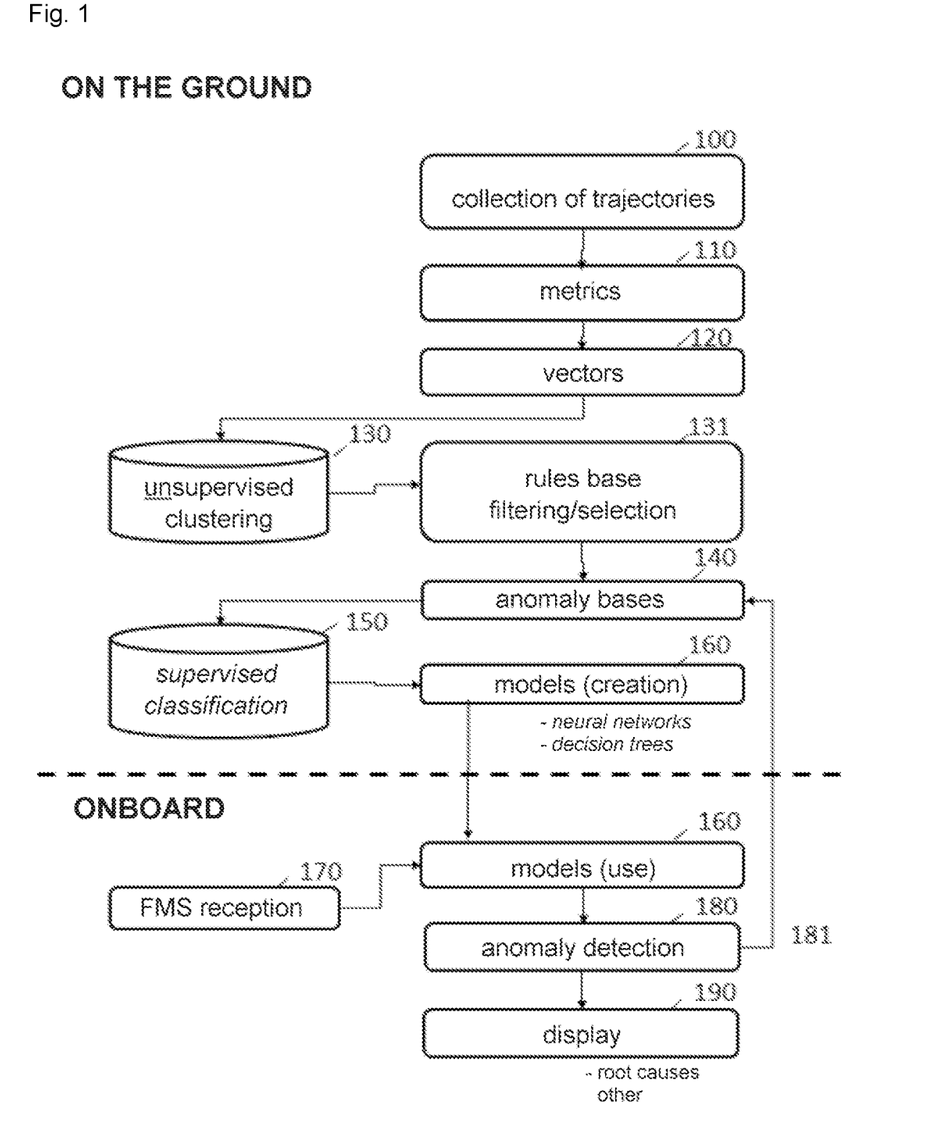
FIG. 1 illustrates examples of steps according to an embodiment of the invention.

FIG. 1 illustrates examples of steps according to an embodiment of the invention.

In a step (100), aircraft trajectories are received (passively) and/or collected (actively). Data silos can be mobilized. The quality of the data can be enhanced upstream in various ways (by sorting, by application of thresholds, by aircraft type, etc.). The data can in particular originate from blockchains, i.e. have been previously the subject of distributed consensus mechanisms.

In a step (110), a metric or a metric distance can be determined, for each or all of the trajectories received.

According to the embodiments, the contents of the trajectories can be diverse. The trajectories can be lateral trajectories, and/or vertical trajectories and/or thrust modes. An airplane piloting mode is generally broken down into "thrust mode" (THR) on the one hand (either adapted or fixed) and into "vertical guidance" on the other hand (e.g. climb, cruising, or descent). These thrust and vertical guidance modes define N piloting modes of the engine used in production (these are modes of the automatic pilot, e.g. in so-called Open Accel, IDLE, "energy sharing" mode, engine idling, with or without airbrakes extended, etc.). For example, an "open accel" mode corresponds to a deep thrust to achieve and maintain predefined target parameters. These N modes correspond to as many models or sets of equations.

In a step (120), vectors are determined. In one embodiment, a vector comprises one or more character strings (symbolic values). For example, in the case of lateral trajectories, it will for example be possible to find sequences of Right, Left and Neutral (Straight) segments, encoded by the characters R, L and N. In the case where the trajectories are expressed in thrust modes, the character strings will be others but will also be symbolically manipulable.

In a way specific to the invention, the trajectories are vectorized, so as to conserve the information (e.g. slope, distance, etc.) but to allow comparisons between the trajectories.

"Clustering" (partitioning) steps can be performed to classify the trajectories into comparable trajectories (short-haul, medium-haul, long-haul). According to the embodiments, vertical trajectories, or lateral trajectories, or flight procedures (e.g. final descent) can be compared. Although belonging to flights of different lengths, comparisons in terms of procedure for example can be made.

In an essentially unsupervised step (130), one or more anomalies which feed an anomaly database (140) are determined. Optionally, one or more logic (and/or heuristic) rules bases can filter the data (known scenarios, filtered abnormal values, etc.), in order to improve the "quality" of the anomaly base. Marginally and optionally, a supervised classification step (150) is performed. This step may or may not make use of annotations by people. In particular, it is possible to use automatic methods to evaluate the anomalies determined in an unsupervised manner. At the output of unsupervised, then (semi) supervised, learning steps, one or more models are created in the step (160) (in the sense of structured data, allowing predictions). Determined using computation resources which may be significant (e.g. elastic cloud), and de facto generally performed on the ground, these models (160) (which "summarize" the learning performed on the ground), are loaded onboard in one or more aircraft, in which they are used.

In the step (170), the data from the avionics are for example loaded into one or more models (160) and one or more anomalies can thus be determined if necessary in the step (180), by analyzing the avionics data flow.

If necessary, if an anomaly is detected, this anomaly can enrich (181) the anomaly base (on the ground, onboard, or synchronized between ground and air).

Figure 2:
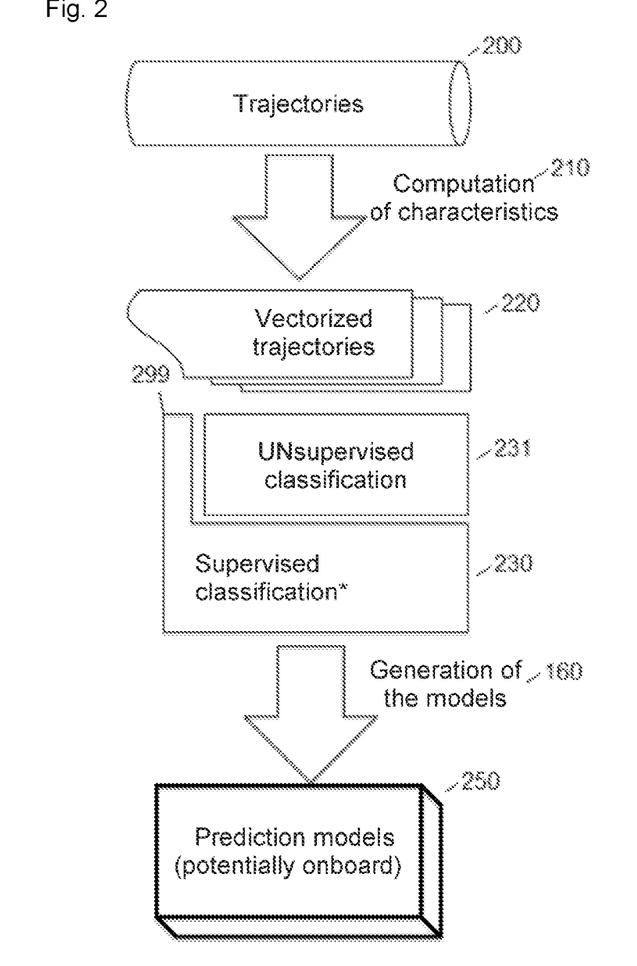
FIG. 2 illustrates the step of determining one or more anomaly detection models that can be loaded onboard.

FIG. 2 illustrates the step of creation (or of definition or of parameterization) of said one or more anomaly detection models based on unsupervised learning (detection of unknown problems). The trajectories (200) are characterized (210), (110), characteristics are determined. The vectorized trajectories (220) are then classified essentially in an unsupervised manner (231) and, at the margin, in a supervised manner (this open loop being able to be closed by coupling with automatic methods). At the output, one or more models 160 can be determined (e.g. one or more neural networks, one or more decision trees, etc.). These models can be loaded onboard.

Figure 3:
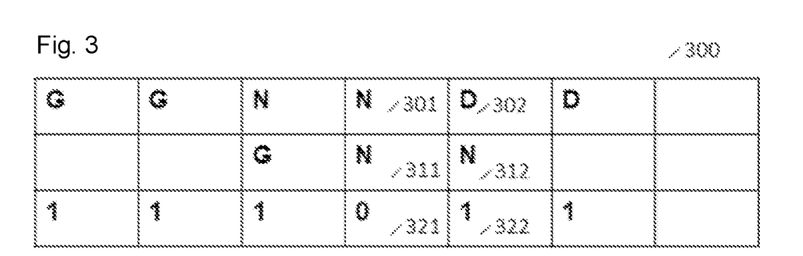
FIG. 3 shows an example of vectorization of the trajectories.

FIG. 3 shows an example of an embodiment for determining the similarity (or sameness) between lateral trajectories of two aircraft (in rows). The example which is illustrated addresses the lateral trajectories of an aircraft, similar computations are possible as to the vertical profiles, or even sequencings of flight procedures (there are some twenty or so distinct types).

In the example which is illustrated, the lateral trajectory is partitioned into segments G (for left), N (for neutral or straight), and D (for right) segments. The radii of the turns are similar from one aircraft to the other and consequently the distance units are sufficient to determine the vectorized trajectories (the lengths of the segments or legs are almost constant). One aircraft A flies a segment N (301) then follows with a segment D (302). Another aircraft B flies a segment N (311) then follows with another segment N (312). When the two trajectories are compared, it can be agreed to assign the score 0 in the case of equality, 1 otherwise (or 2 between G and D). Thus, the comparison between (301) and (311) gives the score of 0 (321) and the comparison between (302) and (312) gives 1. Then, the segment-to-segment scores are summed and the trajectories are all the closer as the score is minimal or small. On the other hand, the greater or maximal the sum of the scores becomes, the more different the trajectories become.

In one embodiment, it is possible to shift the trajectories, in order to perform the comparisons.

Figure 4:
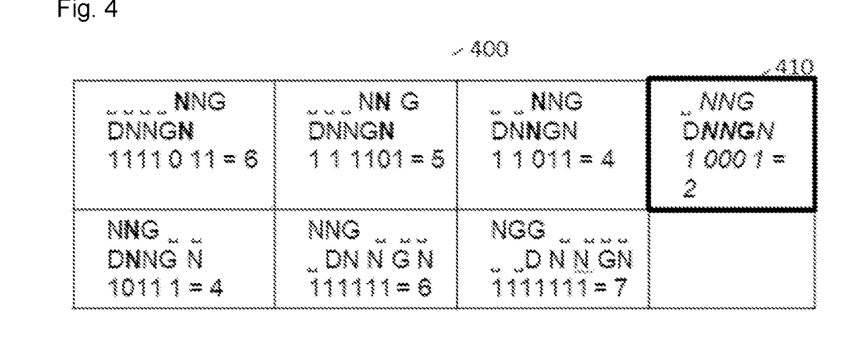
FIG. 4 shows an example of manipulation of the vectorized trajectories.

FIG. 4 illustrates an example of the shifting of lateral trajectories. A trajectory can be composed of segments N (neutral or straight), D (right) and G (left). The two trajectories of the example can be shifted in different ways, the segment-to-segment comparisons then being different, the sums of the scores also. The shift illustrated in 410 is that which minimizes the sum of the scores.

Figure 5:
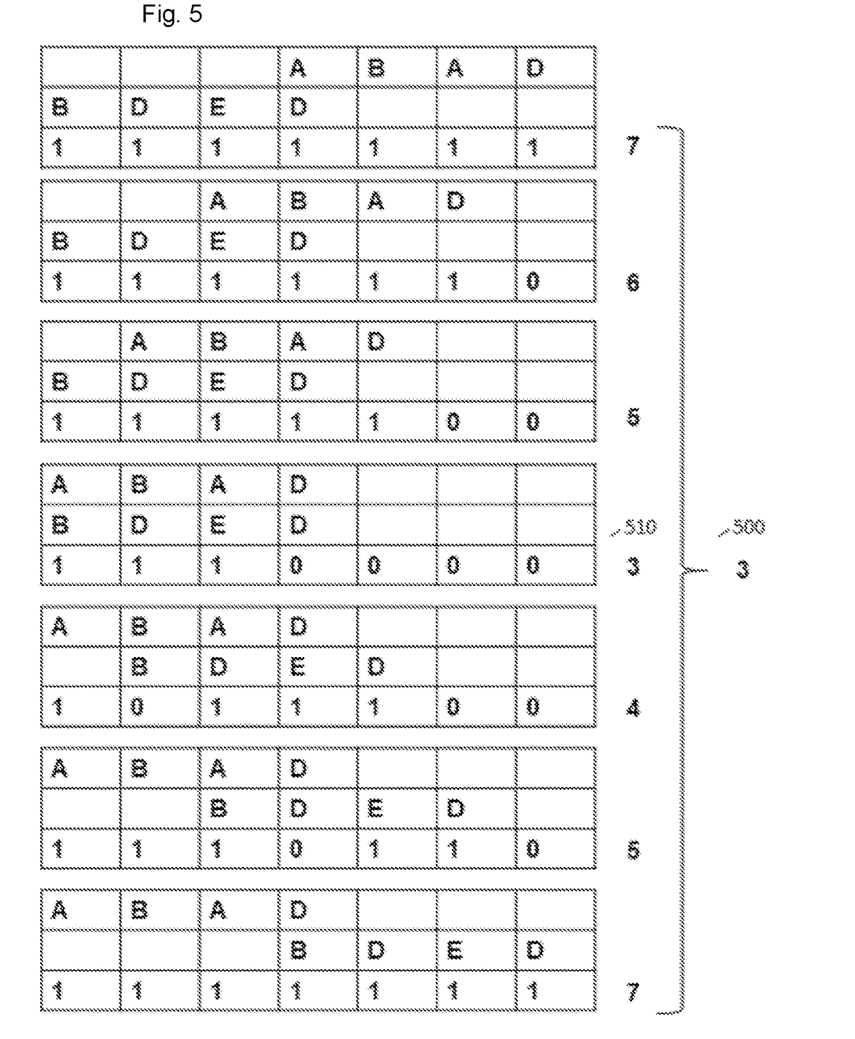
FIG. 5 shows another example of manipulation of the vectorized trajectories.

FIG. 5 shows another example of manipulation of the vectorized trajectories.

The example shows two sequences of enumerators (ABAD and BDED). The enumerators, represented in the example by letters, can represent different objects or trajectories (non-exhaustive): the lateral trajectory (S for Straight, L for Curve Left, R for Curve Right), a vertical trajectory (C for Climb, L for Level, D for Descent), a vertical movement mode profile (C for OPEN CLIMB automatic pilot mode, L for CRUISE automatic pilot mode, D for OPEN DESCENT automatic pilot mode, and F for FPA automatic pilot mode; etc.). Here, the distance minimum is 3 (500), which determines the alignment (510).

The database (140) can be the subject of various processing steps, notably in terms of storage, sorting/filtering, qualification, or distribution.

For sorting/filtering or qualification, one or more overlayers can be applied, by person and/or the machine (notation or evaluation algorithms). An anomaly can be evaluated, confirmed or denied in binary fashion, but according to scales, possibly discrete (e.g. probabilistic approaches, confidence intervals, "ranking", "scoring", etc.). An anomaly can for example be tagged as "critical". The origin of an anomaly can be stored according to whether it results from a real flight or from a computation (simulations); it may in fact involve not reintroducing algorithmic biases associated with said computations. The anomalies can be the object of statistics ("data analytics"): analyses in terms of frequency, by aircraft type, by zone ATC, etc.

For distribution, different embodiments are possible. For example, the database (140) can be interrogatable according to different criteria (locally and/or remotely). For example, a pilot will be able to select a type of aircraft and a precise geographic zone; he or she will find possibly recurrent anomalies, which will for example be able to be associated with common root causes. For display, one embodiment of the invention can comprise a step of displaying one or more saved anomalies with respect to the current flight plan point of the aircraft concerned. Partial selections can therefore be made, and exported.

In one distribution mode, one or more anomalies are stored in a database (140), said database being centralized and able to be loaded onboard wholly or partly. In other embodiments, all or part of the database is extracted and made portable (onboard copy, or online availability). Parts of the database (140) can notably be determined as a function of the flight plan of the aircraft and loaded onboard (e.g. memory, cache, etc.). Access rights (e.g. read/write) can be implemented. In a particular embodiment, the database (140) is administered (i.e. maintained and edited) by the air traffic control authority.

In one distribution mode, the database (140) can be decentralized, for example by using one or more blockchains. This type of storage is advantageous notably in that it means that checks can be made upstream of the storage on the quantity and/or the quality of the anomalies (e.g. distributed consensus vote, keeping a database that is small and light and therefore portable, or, on the other hand, containing a very large number of references). Blockchain storage notably makes it possible to have different actors with divergent or non-congruent interests cooperate, allowing them to aggregate very large quantities of data, in turn allowing useful analyses (which would not have been possible in the context of data silos). In one embodiment, the storage and the distribution of the database (140) by blockchains provides the condition of existence of a large aggregation of data upstream allowing relevant analyses downstream ("private data analytics on shared Big Data").

In some embodiments, the storage of the database (140) can be hybrid, i.e. have characteristics of centralization and of decentralization (the centralized data can be in plain text and the complementary encrypted data or metadata can reside in the blockchains).

The location of the computation can vary: to date, resources both local (onboard) and remotely accessed (Cloud) can be mobilized. There is also justification for thinking that very significant computation means can be—or ultimately we will be able to be—onboard. However, an assumption of connectivity (e.g. for the synchronization of the results of the analyses) which would be absolutely continuous, uninterrupted, cannot be retained. But the need for it is continuous: a trajectory anomaly must be detected as early as possible.

The present invention can be implemented using hardware and/or software elements. It can be available as a computer program product on a computer-readable medium. The medium can be electronic, magnetic, optical or electromagnetic.

In one embodiment, an aircraft is equipped with a module for communicating and collaboratively sharing data derived from the computers onboard the aircraft. This hardware module can be connected with various users and/or suppliers of data. On the ground, computing resources can be significant (e.g. elastic Cloud).

In hardware terms, the embodiments of the invention can be implemented by computer. The computer can be a rack or a tablet or an EFB or a software part incorporated in the FMS, etc. The architecture can be distributed, for example of the "cloud computing" type. Peer-to-peer servers, entirely or partially distributed (existence of centers) can interact. There can be one or more prioritized nodes, when it involves a private cloud or private blockchain. Access can be multi-platform (e.g. from EFB, WebApp, ground access, etc.). One or more EFBs can interact with one or more FMSs.

The machine learning can correspond to hardware architectures which can be emulated by computer (e.g. CPU-GPU), but in some cases not (learning-dedicated circuits may exist), for example FPGA circuits.

The energy efficiency of the onboard systems can be advantageous. The neural network-based models encode the knowledge learned (generally) on the ground: the models are light and therefore can be loaded onboard. Onboard, the avionics data can be processed in flows and anomalies can be detected rapidly.

In hardware terms, according to the embodiments, the method according to the invention can be implemented on or by one or more neural networks. A neural network according to the invention can be one or more neural networks chosen from among the neural networks comprising: a) an artificial neural network; b) an acyclic artificial neural network, e.g. a multilayer perceptron, thus being distinguished from the recurrent neural networks; c) a feedforward neural network; d) a Hopfield neural network (a discrete time recurrent neural network model in which the matrix of the connections is symmetrical and null on the diagonal and in which the dynamic is asynchronous, a single neuron being updated on each time unit); e) a recurrent neural network (composed of interconnected units interacting non-linearly and for which there is at least one cycle in the structure); f) a convolutional neural network ("CNN" or "ConvNet", a type of feedforward acyclic artificial neural network, based on multilayer stacking of perceptrons) or g) a generative adversarial network (classed as GANs, a class of unsupervised learning algorithms).

The invention claimed is:

1. A computer-implemented method for analysis of a plurality of aircraft trajectories, the method comprising the steps of:
   receiving data that includes the plurality of aircraft trajectories, wherein the plurality of aircraft trajectories are lateral trajectories, vertical trajectories, and/or thrust modes;
   breaking said plurality of aircraft trajectories down into a plurality of vectors, each vector of the plurality of vectors comprising one or more sequences of enumerators, and scoring differences of the one or more sequences of enumerators of at least one of said plurality of vectors with another one of said plurality of vectors;
   shifting one or more of the one or more sequences of enumerators by one or more positions to align at least one of said plurality of vectors with another one of said plurality of vectors to minimize scored differences;
   detecting in one or more of said plurality of aircraft trajectories, that include at least one of said plurality of vectors and at least another one of said plurality of vectors that have been aligned, one or more anomalies by unsupervised classification;
   training a supervised algorithm on a basis of trajectories labeled by an unsupervised algorithm to determine one or more trajectory anomaly detection models in a supervised manner, wherein the trajectory anomaly detection models correlate the one or more anomalies detected with one or more predefined root causes, wherein the one or more anomalies detected are stored in a database that is at least partly decentralized by using one or more blockchains;
   using the one or more trajectory anomaly detection models onboard a flight for displaying on a Human-Machine Interface (HMI), to a pilot, said one or more predefined root causes to provide the pilot with assistance in flight management; and
receiving a confirmation of an existence of a first anomaly of said one or more anomalies detected from the pilot via the HMI.

2. The method as claimed in claim 1, wherein the unsupervised classification uses one or more density-based algorithms.

3. The method as claimed in claim 2, wherein one of the one or more density-based algorithms comprise a Density-Based Spatial Clustering of Applications with Noise (DBSCAN) type and/or an Isolation Forest (IFOREST) type.

4. The method as claimed in claim 1, wherein the trajectory anomaly detection models comprise one or more neural networks and/or decision trees.

5. The method as claimed in claim 1, further comprising the step of:
receiving a denial of an existence of a second anomaly of said one or more anomalies detected from the pilot via the HMI.

6. The method as claimed in claim 1, further comprising the step of:
receiving trajectory avionics data of an aircraft, wherein the one or more anomalies detected are based on said one or more trajectory anomaly detection models and the trajectory avionics data.

7. The method as claimed in claim 6, wherein the received trajectory avionics data of the aircraft comes from a flight management system.

8. The method as claimed in claim 6, further comprising the step of:
communicating said one or more anomalies detected during the flight of the aircraft.

9. The method as claimed in claim 1, wherein said database is at least partly centralized and is wholly or partly interrogatable.

10. A non transitory computer program product, said non-transitory computer program product comprising code instructions that when executed on a computer causes performance of a method comprising the steps of:
receiving data that includes a plurality of aircraft trajectories, wherein the plurality of aircraft trajectories are lateral trajectories, vertical trajectories, and/or thrust modes;
breaking said plurality of aircraft trajectories down into a plurality of vectors, each vector of the plurality of vectors comprising one or more sequences of enumerators, and scoring differences of the one or more sequences of enumerators of at least one of said plurality of vectors with another one of said plurality of vectors;
shifting one or more of the one or more sequences of enumerators by one or more positions to align at least one of said plurality of vectors with another one of said plurality of vectors to minimize scored differences;
detecting in one or more of said plurality of aircraft trajectories, that include at least one of said plurality of vectors and at least another one of said plurality of vectors that have been aligned, one or more anomalies by unsupervised classification;
training a supervised algorithm on a basis of trajectories labeled by an unsupervised algorithm to determine one or more trajectory anomaly detection models in a supervised manner, wherein the trajectory anomaly detection models correlate the one or more anomalies detected with one or more predefined root causes, wherein the one or more anomalies detected are stored in a database that is at least partly decentralized by using one or more blockchains;
using the one or more trajectory anomaly detection models onboard a flight for displaying on a Human-Machine Interface (HMI), to a pilot, said one or more predefined root causes to provide the pilot with assistance in flight management; and
receiving a confirmation of an existence of an anomaly of said one or more anomalies detected from the pilot via the HMI.

11. A system for analyzing a plurality of aircraft trajectories, the system comprising at least one computer configured to implement the steps of a method comprising the steps of:
receiving data that includes the plurality of aircraft trajectories, wherein the plurality of aircraft trajectories are lateral trajectories, vertical trajectories, and/or thrust modes;
breaking said plurality of aircraft trajectories down into a plurality of vectors, each vector of the plurality of vectors comprising one or more sequences of enumerators, and scoring differences of the one or more sequences of enumerators of at least one of said plurality of vectors with another one of said plurality of vectors;
shifting one or more of the one or more sequences of enumerators by one or more positions to align at least one of said plurality of vectors with another one of said plurality of vectors to minimize scored differences;
detecting in one or more of said plurality of aircraft trajectories, that include at least one of said plurality of vectors and at least another one of said plurality of vectors that have been aligned, one or more anomalies by unsupervised classification;
training a supervised algorithm on a basis of trajectories labeled by an unsupervised algorithm to determine one or more trajectory anomaly detection models in a supervised manner, wherein the trajectory anomaly detection models correlate the one or more anomalies detected with one or more predefined root causes, wherein the one or more anomalies detected are stored in a database that is at least partly decentralized by using one or more blockchains;
using the one or more trajectory anomaly detection models onboard a flight for displaying on a Human-Machine Interface (HMI), to a pilot, said one or more predefined root causes to provide the pilot with assistance in flight management; and
receiving a confirmation of an existence of an anomaly of said one or more anomalies detected from the pilot via the HMI.

12. The system as claimed in claim 11, wherein the at least one computer comprises one or more neural networks chosen from among the neural networks comprising:
an artificial neural network;
an acyclic artificial neural network;
a recurrent neural network;
a feedforward neural network;
a convolutional neural network; and/or
a generative adversarial neural network.

\* \* \* \* \*